(12) United States Patent
Durga et al.

(10) Patent No.: US 8,890,214 B2
(45) Date of Patent: Nov. 18, 2014

(54) METHOD OF MANUFACTURING SIDEWALL SPACERS ON A MEMORY DEVICE

(75) Inventors: Panda Durga, Boise, ID (US); Jaydip Guha, Boise, ID (US); Robert Kerr, Boise, ID (US)

(73) Assignee: Nan Ya Technology Corporation, Tao-yuan Hsien (TW)

( * ) Notice: Subject to any disclaimer, the term of this patent is extended or adjusted under 35 U.S.C. 154(b) by 327 days.

(21) Appl. No.: 13/335,578

(22) Filed: Dec. 22, 2011

(65) Prior Publication Data

US 2013/0161700 A1    Jun. 27, 2013

(51) Int. Cl.
*H01L 31/0328* (2006.01)
*H01L 21/8242* (2006.01)
*H01L 27/105* (2006.01)
*H01L 29/66* (2006.01)

(52) U.S. Cl.
CPC .......... *H01L 27/105* (2013.01); *H01L 29/6656* (2013.01)
USPC .......... 257/200; 257/202; 257/296; 257/316; 257/E21.249; 257/E21.626; 257/E21.645; 257/E27.081; 438/211; 438/241; 438/258

(58) Field of Classification Search
CPC . H01L 27/105; H01L 27/115; H01L 27/1052; H01L 29/6656
USPC .................. 257/200, 202, 296, 316, E21.249, 257/E21.626, E21.645, E27.081; 438/211, 438/241, 258
See application file for complete search history.

(56) References Cited

U.S. PATENT DOCUMENTS

| 6,248,623 | B1 * | 6/2001 | Chien et al. | 438/241 |
| 6,815,283 | B2 * | 11/2004 | Lee | 438/211 |
| 7,459,742 | B2 * | 12/2008 | Hwang et al. | 257/296 |
| 2003/0151069 | A1 * | 8/2003 | Sugimae et al. | 257/200 |

FOREIGN PATENT DOCUMENTS

TW        200926305       6/2009

OTHER PUBLICATIONS

Office Action from Republic of China, Taiwan Patent Office in a corresponding Patent Application No. 101112168 dated Feb. 21, 2014, 5 pages in Chinese, with 1 page of abstract in English.

* cited by examiner

*Primary Examiner* — Dao H Nguyen
(74) *Attorney, Agent, or Firm* — Juan Carlos A. Marquez; Bacon & Thomas PLLC

(57) ABSTRACT

The present invention relates to a method of manufacturing sidewall spacers on a memory device. The method comprises forming sidewall spacers on a memory device having a memory array region and at least one peripheral circuit region by forming a first sidewall spacer adjacent to a word line in the memory array region and a second sidewall spacer adjacent to a transistor in the peripheral circuit region. The first sidewall spacer has a first thickness and the second sidewall spacer has a second thickness, wherein the second thickness is greater than the first thickness.

7 Claims, 10 Drawing Sheets

METHOD OF MANUFACTURING SIDEWALL SPACERS ON A MEMORY DEVICE

TECHNICAL FIELD

The present invention generally relates to a manufacturing method of a memory device. More particularly, the present invention relates to a method of manufacturing sidewall spacers on a memory device.

BACKGROUND

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of various features of the integrated circuit devices, e.g., transistors, word lines, etc. For example, all other things being equal, the smaller the channel length of the transistor, the faster the transistor will operate. Thus, there is a constant drive to reduce the size, or scale, of the features of a typical memory device to increase the overall speed and capabilities of the memory device, as well as the speed and capabilities of electronic devices incorporating such memory devices.

A variety of semiconductor memory devices are used extensively in many consumer products. Illustrative examples of such memory devices include dynamic random access memory (DRAM) and flash memory devices. FIG. 1 depicts an illustrative layout of a schematically depicted DRAM memory device 10 comprised of a semiconducting substrate 19. In general, the memory device 10 is comprised of a memory array 11 and a plurality of peripheral circuits 12. By way of example only, a plurality of schematically depicted illustrative peripheral circuits 12 are depicted in FIG. 1. More specifically, the illustrative peripheral circuits 12 comprise read-write circuits 12A, sense amp circuits 12B and power management circuits 12C. The illustrative peripheral circuits depicted in FIG. 1 are not exhaustive of all such peripheral circuits 12 on the memory device 10. In other words, the peripheral circuit 12 may comprise any circuitry on the memory device 10 other than the circuitry found within the memory array 11.

The memory array 11 includes a multitude of memory cells arranged in rows and columns. Each of the memory cells is structured for storing digital information in the form of a logical high (i.e., a "1") or a logical low (i.e., a "0"). To write (i.e., store) a bit into a memory cell, a binary address having portions identifying the cell's row (the "row address") and column (the "column address") is provided to addressing circuitry in the memory device 10 to activate the cell, and the bit is then supplied to the cell. Similarly, to read (i.e., retrieve) a bit from a memory cell, the cell is again activated using the cell's memory address and the bit is then output from the cell.

FIG. 2 is a cross-sectional view of the line 1-1 in FIG. 1 showing a portion of the illustrative memory device 10. Depicted therein is an illustrative transistor 15, which is a portion of a peripheral circuit 12A, and a plurality of word lines 111 within the memory array 11. Typically, the memory array 11 is much more densely packed than the peripheral circuits 12A, i.e., the pitch between adjacent word lines 111 within the memory array 11 is typically much tighter than that in the peripheral circuits 12. For example, the spacing 112 between adjacent word lines 111 in the memory array 11 may be approximately 50 to 90 nm, whereas the spacing between adjacent transistors 15 in the peripheral circuits 12A may be on the order of approximately 240 to 600 nm.

As indicated in FIG. 2, the illustrative transistor 15 comprises a gate insulation layer 151, a gate electrode 152, a metal layer 153 and a cap layer 154 comprised of, for example, silicon nitride. The transistor 15 further comprises a plurality of source/drain regions 13 and a sidewall spacer 14. The word lines 111 within the memory array 11 also include a similar structure. The feature size W of the word lines 111 may be on the order of approximately 50 to 90 nm. Typically, the spacing 112 between adjacent word lines 111 in the array 11 is approximately equal to the feature size W of the word line 111. A sidewall spacer 113 is also formed adjacent to the word lines 111 depicted in FIG. 2. Lastly, isolation regions 114 are formed in the substrate 19 as is well known in the art.

Typically, the sidewall spacers 14 on the peripheral circuits 12A, as well as the sidewall spacers 113 formed in the memory array 11, are formed at the same time and from the same layer of material. Thus, the thickness D1 of the spacers 14 formed in the peripheral circuits 12A is approximately the same as the thickness D2 of the spacers 113 formed within the memory array 11. Due to the densely packed nature of the word lines 111 in the memory array 11, the thickness D2 of the spacers 113 is limited by the size of a spacer 113 that may be reliably formed in the very small spacing 112 between adjacent word lines 111. This is problematic in that, for a variety of reasons, it may be desirable to make the spacer 14 on the peripheral circuits 12A thicker than the spacer 113 within the memory array 11. For example, formation of the source/drain regions 13 of the transistors 15 in the peripheral circuits 12A generally involves an initial lightly doped drain (LDD) implant, followed by the formation of spacers 14 and then followed by a source/drain implant step. However, since the spacer 14 and the spacer 113 are typically formed by the same process, the thickness D1 is similar to the thickness D2. Thus, the thickness D1 of the spacer 14 is constrained by the spacing 112 between the word lines 111 in the memory array 11, and the source/drain regions 13 on the peripheral circuits 12A may not be located as precisely or formed as deep as they would otherwise be if the formation of the spacers 14 was independent of the formation of the spacers 113. Even if the spacers 14 could be formed independent of the formation of the spacers 113, the process of forming the spacers 14 and 113 separately would require an additional photolithographic process that would increase manufacturing cost.

The present invention is directed to various methods that may solve, or at least reduce, some or all of the aforementioned problems.

SUMMARY

To solve the problems of the above-mentioned prior art, the present invention discloses a method of manufacturing sidewall spacers on a memory device. The method comprises the following steps: providing a substrate including a peripheral circuit region and a memory array region, wherein at least one electronic component layer is defined in the peripheral circuit region and the memory array region, and the electronic component layer includes at least one transistor and word line/digit line; depositing a first dielectric layer on the peripheral circuit region and the memory array region; depositing a second dielectric layer on the first dielectric layer; etching the second dielectric layer to expose the first dielectric layer; depositing a third dielectric layer in the peripheral circuit region and the memory array region; coating a masking layer in the peripheral circuit region; etching the third dielectric layer in the memory array region to expose the second dielectric layer and the first dielectric layer; etching all of the second dielectric layer in the memory array region; removing the masking layer in the peripheral circuit region; etching the first dielectric layer and the third dielectric layer on the electronic component layer to expose the transistor and the word line/digit line, wherein a composite spacer is formed adjacent to the transistor, a spacer is formed adjacent to the word line/digit line, and the spacer has a first thickness; and removing the second dielectric layer and the third dielectric layer in the peripheral circuit region to define an L-shaped cross section of the first dielectric layer having a second thickness in the peripheral circuit region, wherein the second thickness is greater than the first thickness.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for to carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

Figure 1:
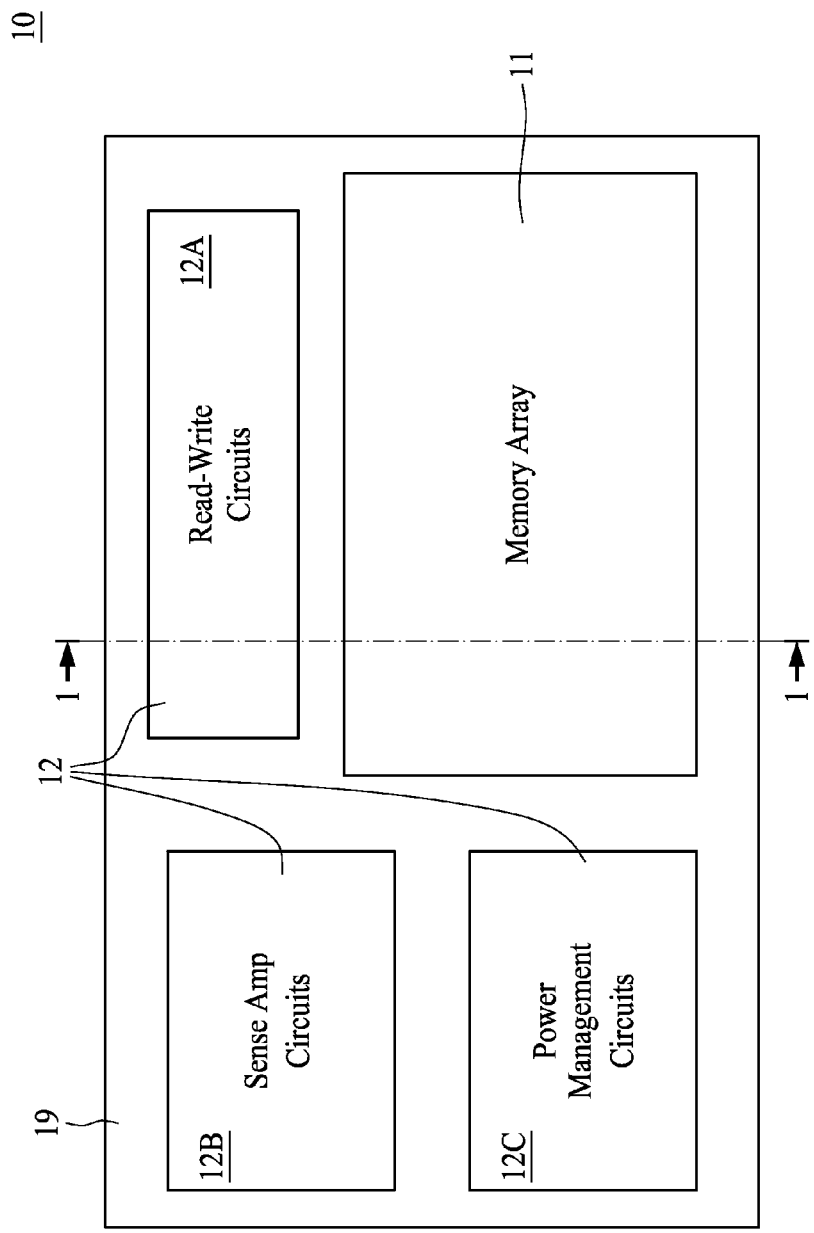
FIG. 1 shows a schematic depiction of a plan view of an illustrative memory device.
Figure 2:
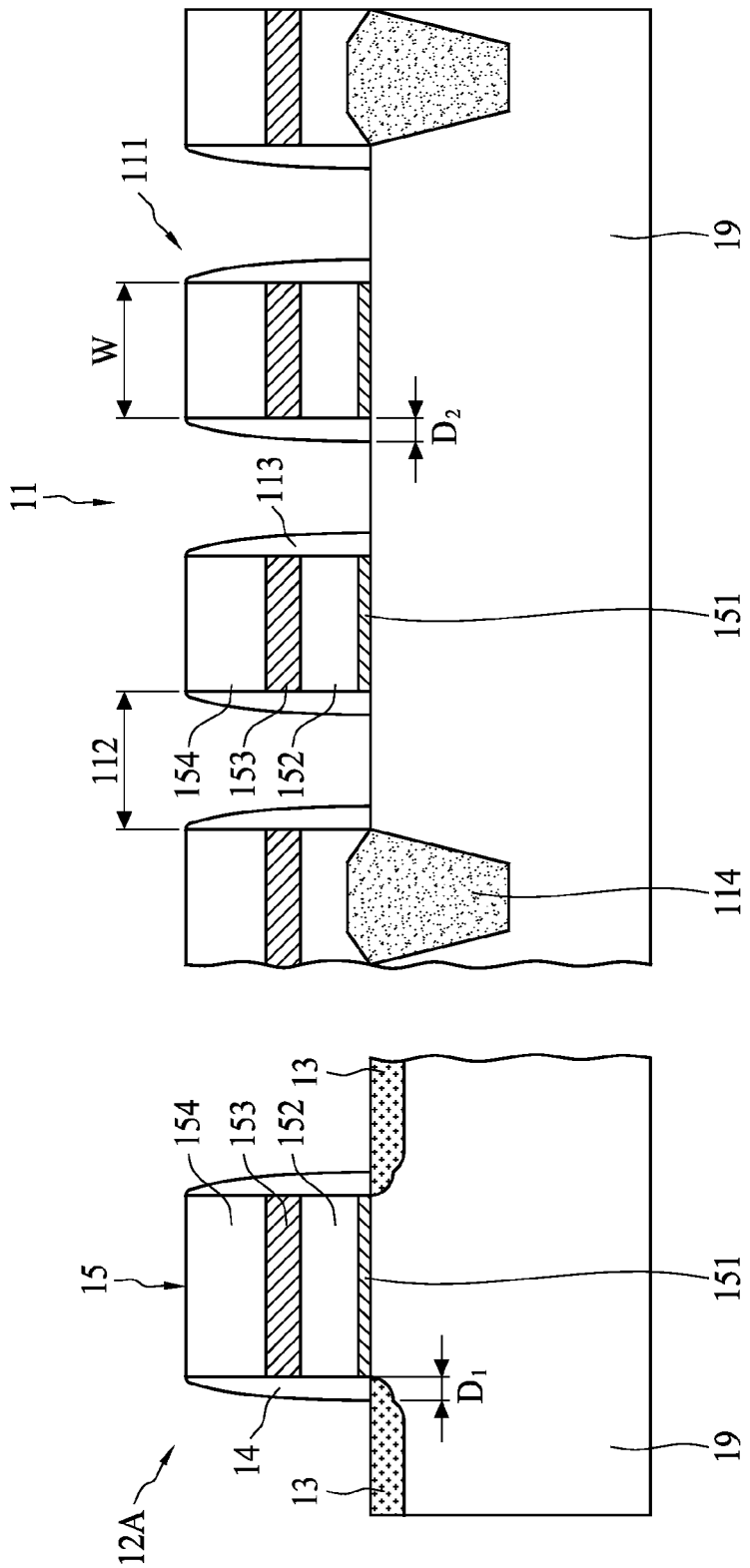
FIG. 2 shows a partial cross-section of the memory device depicted in FIG. 1 along the line 1-1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but is instead intended to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It should be appreciated that in the development of any such actual embodiment, numerous implementation-specific decisions must be made to achieve the developers' specific goals, such as compliance with system-related and business-related constraints, which will vary from one implementation to another. Moreover, it should be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 3 to 10 depict one illustrative embodiment of a method of manufacturing sidewall spacers on a memory device in accordance with the present invention. As will be recognized by those skilled in the art after a complete reading of the present application, the present invention has broad application and may be employed in manufacturing a variety of memory devices, e.g., DRAMs, flash memory, PROMs (programmable read-only memory), OTP (one time programmable) devices, etc. Moreover, the illustrative memory devices depicted herein may be employed in a variety of products, e.g., computers, televisions, and other forms of electronic devices. Thus, the illustrative examples depicted herein should not be considered as limitations of the present invention.

Figure 3:
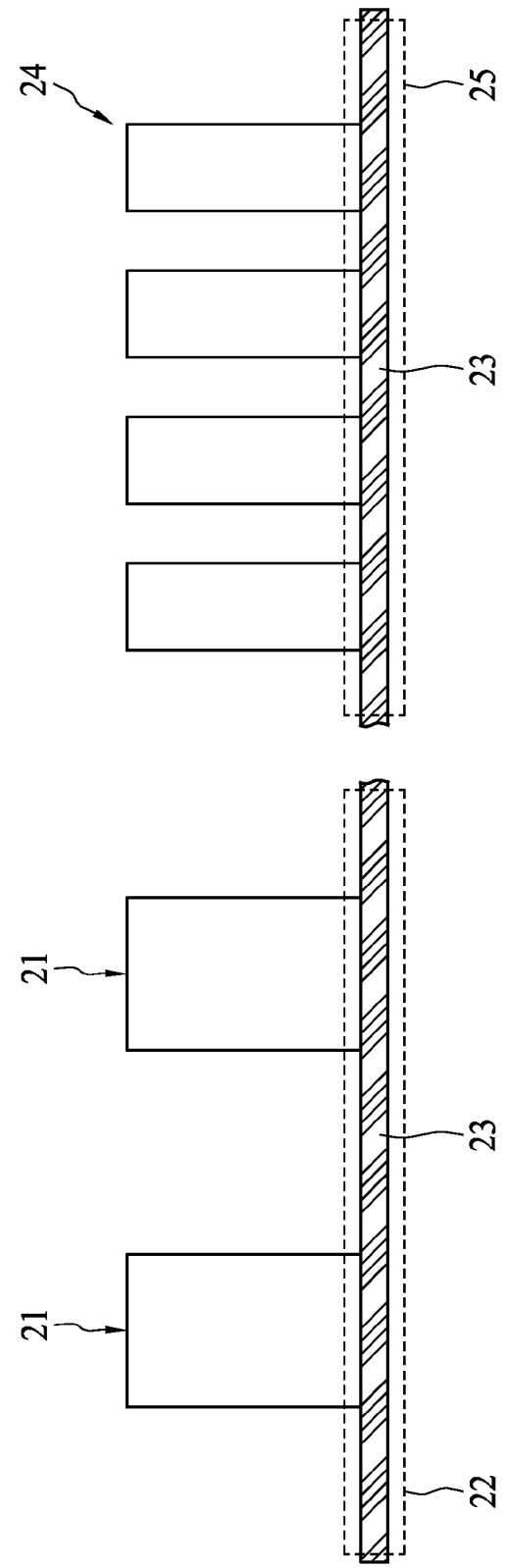
FIG. 3 to FIG. 10 illustrate one illustrative process flow for forming the sidewall spacers on a memory device in accordance with the present invention.

FIG. 3 depicts an illustrative structure for manufacturing a memory device. At the point of manufacture, the gate stack structure (not shown) of the transistor 21 in a peripheral circuit region 22 of the substrate 23 has been formed and the word line/digit line 24 stacks in a memory array region 25 of the substrate 23 have also been formed. In other words, the substrate 23 includes the peripheral circuit region and the memory array region and an electronic component layer including at least one transistor 21 and word line/digit line 24 is defined in the peripheral circuit region 22 and the memory array region 25, respectively. In other words, the electronic component layer is deposited on the substrate 23. Also, at this point in the fabrication process, an ion implantation process has been performed to form LDD regions (not shown) in the substrate 23 for the transistor 21. All of the processing depicted up to this point of fabrication of the memory device may be performed in accordance with known manufacturing techniques.

Figure 4:
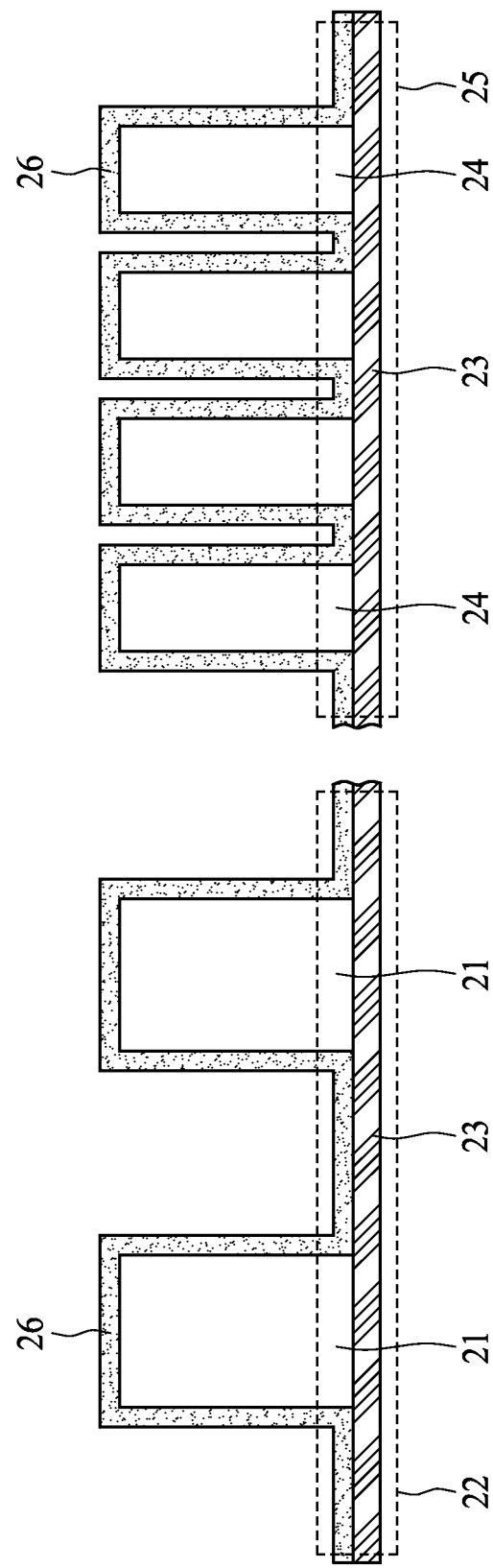

As indicated in FIG. 4, a first dielectric layer 26 is formed across the substrate 23 in the peripheral circuit region 22 as well as the memory array region 25. In other words, the first dielectric layer 26 is deposited on the substrate 23 and the electronic component layer in the peripheral circuit region 22 and the memory array region 25. The spacer material of the first dielectric layer 26 may include a variety of different materials that may be formed by a variety of known techniques. For example, the first dielectric layer 26 may be selected from the group of silicon nitride, silicon oxynitride, or materials that may be selectively etched with respect to silicon or silicon dioxide. The thickness of the first dielectric layer 26 may vary. In one illustrative embodiment shown in FIG. 4, the first dielectric layer 26 may have a thickness of approximately 10 to 30 nm, and, in another particularly illustrative embodiment (not shown), the thickness may be approximately 15 to 27 nm. The first dielectric layer 26 may be formed by performing a variety of known deposition processes, e.g., a chemical vapor deposition process, a plasma enhanced chemical vapor deposition process, atomic layer deposition, etc.

Figure 5:
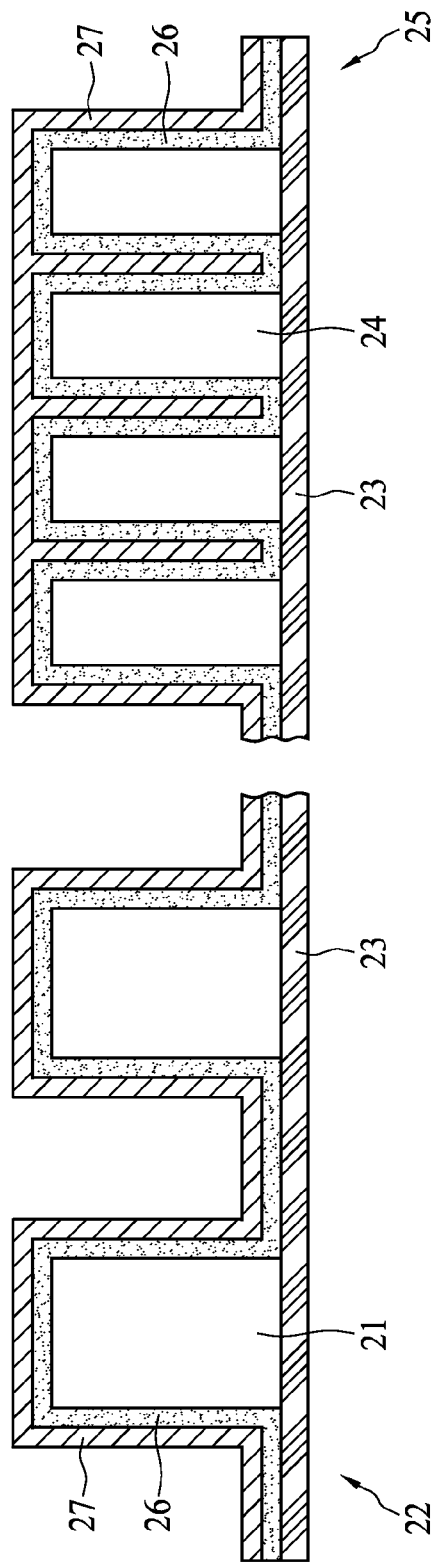

As indicated in FIG. 5, a second dielectric layer 27 is deposited on the first dielectric layer 26 and formed across the substrate 23 in the peripheral circuit region 22 as well as the memory array region 25. The spacer material of the second dielectric layer 27 may include a variety of different materials that may be formed by a variety of known techniques. For example, the second dielectric layer 27 may be selected from the group of silicon dioxide, silicon oxynitride, oxides of silicon that can be selectively etched with respect to silicon nitride, etc. The thickness of the second dielectric layer 27 may vary. In particular, the thickness of the second dielectric layer 27 can be set such that the second dielectric layer 27 is conformally deposited over the peripheral circuit regions 22, but completely fills the space in between the word lines/digit lines 24 in the memory array region 25 as indicated in FIG. 5. In one illustrative embodiment shown in FIG. 5, the second dielectric layer 27 may have a thickness of approximately 10 to 30 nm, and, in another particularly illustrative embodiment (not shown), the thickness may be approximately 17 to 25 nm. The second dielectric layer 27 may be formed by performing a variety of known deposition processes, e.g., a chemical vapor deposition process, a plasma enhanced chemical vapor deposition process, atomic layer deposition, etc. In general, as will be discussed more fully below, the second dielectric layer 27 should be comprised of a material that is selectively etchable with respect to the material of the first dielectric layer 26. For example, if the first dielectric layer 26 is comprised of silicon nitride, then the second dielectric layer 27 may be comprised of silicon dioxide, and vice-versa. Of course, many different material combinations are possible.

Figure 6:
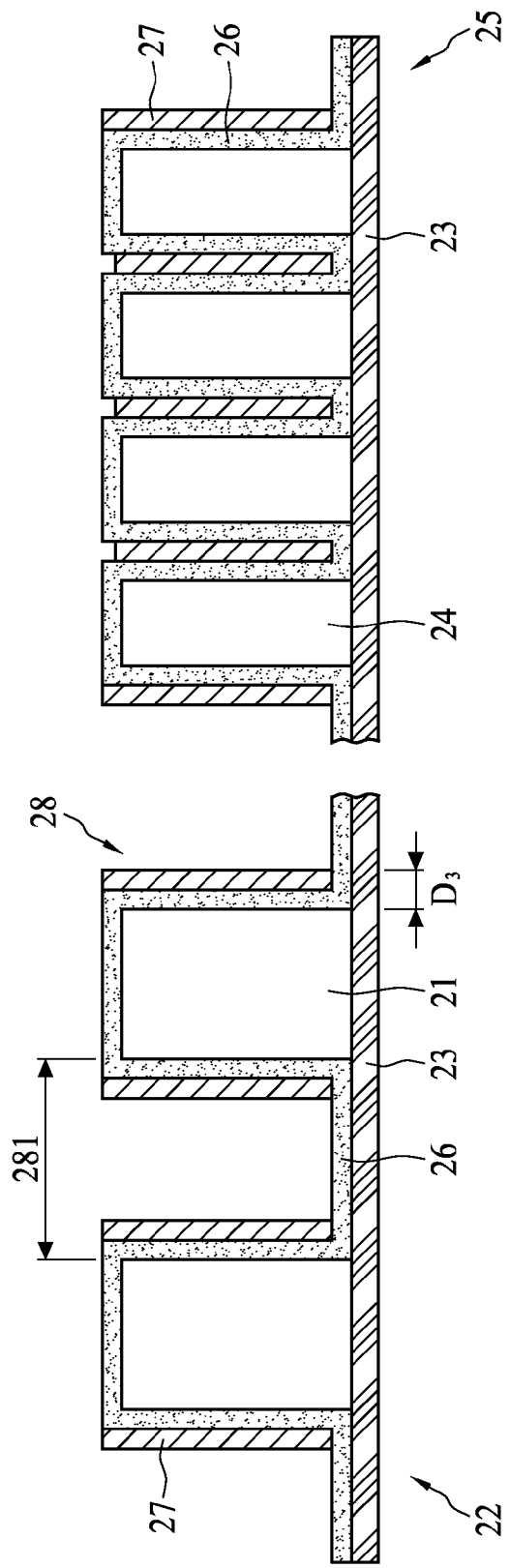

As shown in FIG. 6, the structure is exposed for further etching processing, e.g., an anisotropic etching process has been performed on the second dielectric layer 27 to define sidewall spacers 28 adjacent to the transistor 21. The sidewall spacers 28 in the peripheral circuit region 22 have a generally tapered cross-sectional configuration and a thickness D3. In other words, the first dielectric layer 26 is exposed to the electronic component layer in the peripheral circuit region 22 and the memory array region 25, after the second dielectric layer 27 is etched. Additionally, the second dielectric layer 27 is etched only partially in the space between the word line/digit line 24 of the memory array region 25 due to full thickness bridging as shown in FIG. 6. In one illustrative embodiment shown in FIG. 6, the thickness D3 of the spacers 28 may be approximately 25% of the space 281 between the transistors 21. In one particularly illustrative embodiment, the thickness D3 of the spacers 28 may be approximately 15 to 27 nm. The etching process parameters and the etchant materials employed to form the spacers 28 to the desired thickness D3 are well known to those skilled in the art and will not be discussed further so as to not obscure the present invention. In addition, after the etching process, the first dielectric layer 26 is exposed atop the transistor 21 and the word line/digit line 24.

Figure 7:
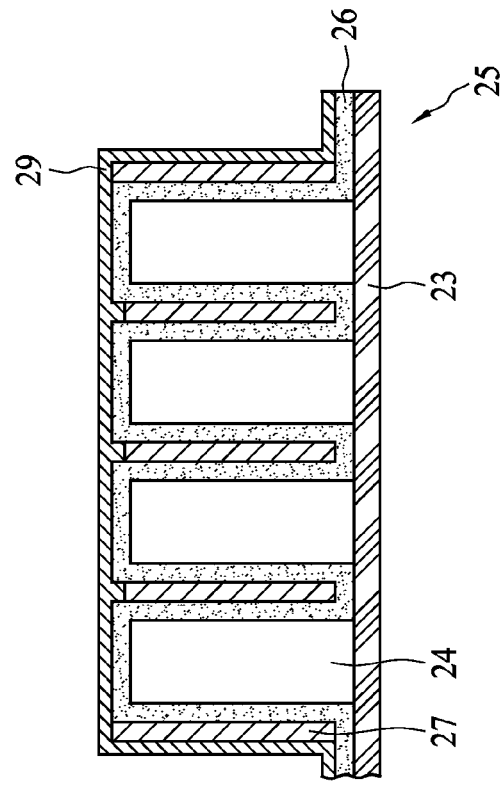
Figure 7:
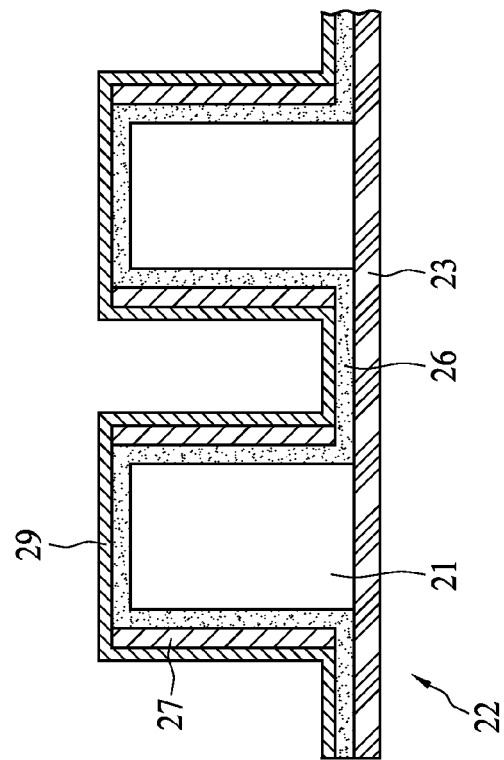

As indicated in FIG. 7, a third dielectric layer 29 is deposited on the first dielectric layer 26 and the second dielectric layer 27 in the peripheral circuit region 22 as well as the memory array region 25. In other words, the third dielectric layer 29 is deposited on the electronic component layer and adjacent to the second dielectric layer 27. The material of the third dielectric layer 29 may include a variety of different materials that may be formed by a variety of known techniques. For example, the third dielectric layer 29 may be selected from the group of silicon nitride, silicon oxynitride, or materials that may be selectively etched with respect to silicon or silicon dioxide. The thickness of the third dielectric layer 29 may vary. In one illustrative embodiment shown in FIG. 7, the third dielectric layer 29 may have a thickness of approximately 10 to 30 nm, and, in another particularly illustrative-embodiment (not shown), the thickness may be approximately 12 to 19 nm. The third dielectric layer 29 may be formed by performing a variety of known deposition processes, e.g., a chemical vapor deposition process, a plasma enhanced chemical vapor deposition process, atomic layer deposition, etc. In general, as will be discussed more fully below, the third dielectric layer 29 should be comprised of a material that is selectively etchable with respect to the material of the second dielectric layer 27. For example, if the third dielectric layer 29 is comprised of silicon nitride, then the second dielectric layer 27 may be comprised of silicon dioxide, and vice-versa. Of course, many different material combinations are possible.

Figure 8:
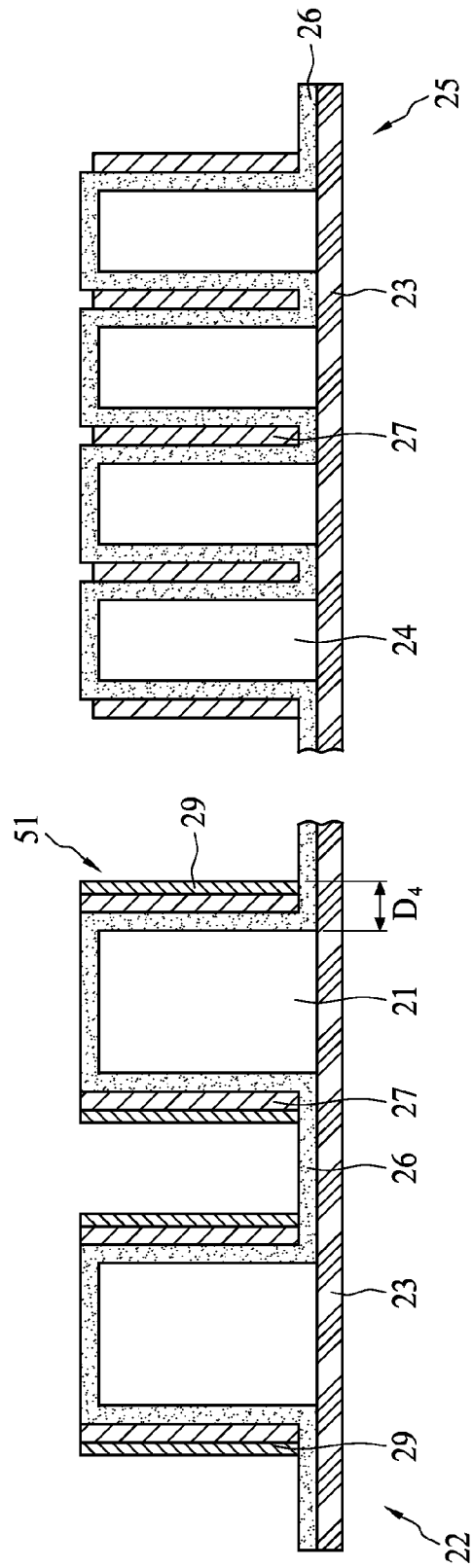

As shown in FIG. 8, the structure is exposed for further etching processing, e.g., an anisotropic etching process has been performed on the third dielectric layer 29 to define sidewall spacers 51 adjacent to the transistor 21. The sidewall spacers 51 in the peripheral circuit region 22 have a generally tapered cross-sectional configuration and a thickness D4. In other words, the first dielectric layer 26 is exposed to the electronic component layer in the peripheral circuit region 22 and the memory array region 25, after the third dielectric layer 29 is etched. In one particularly illustrative embodiment, the thickness D4 of the spacers 51 may be approximately 15 to 27 nm. The etching process parameters and the etchant materials employed to form the spacers 51 to the desired thickness D4 are well known to those skilled in the art and will not be discussed further so as to not obscure the present invention. In addition, after the etching process, the first dielectric layer 26 is exposed atop the transistor 21 and the word line/digit line 24. In one particularly illustrative embodiment, this anisotropic spacer etching process on the third dielectric layer 29 also exposes the second dielectric layer 27 in the space between the word lines/digit lines 24 of the memory array region 25 as shown in FIG. 8.

Figure 9:
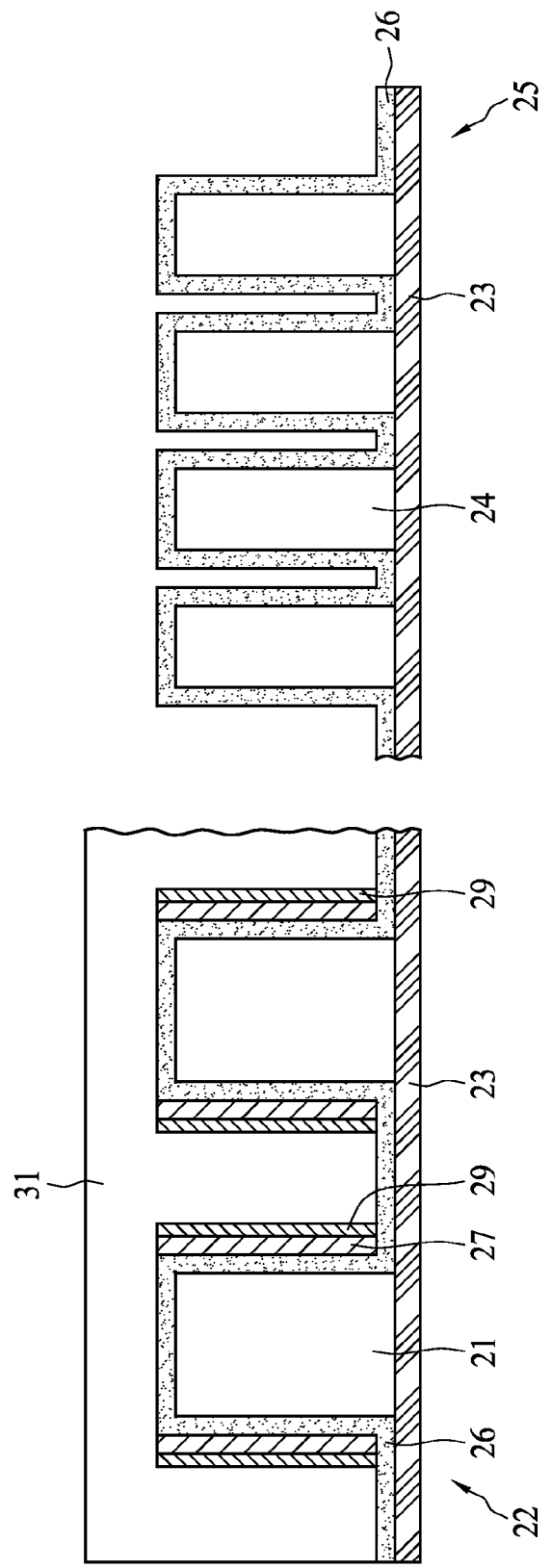

Next, as indicated in FIG. 9, a photoresist masking layer 31 is formed above the peripheral circuit region 22 while leaving the memory array region 25 exposed for further processing. In other words, the masking layer 31 is coated in the peripheral circuit region 22. Particularly, the masking layer 31 is deposited on the third dielectric layer 29. The masking layer 31 can be a DUV photoresist with a thickness ranging from 4000 Å to 8000 Å. Also as indicated in FIG. 9, an etching process, e.g., an isotropic etching process, has been performed on the second dielectric layer 27 in the memory array region 25 to expose the first dielectric layer 26 between the word lines/digit lines 24 in the memory array region 25. The etching process parameters and the etchant materials employed to etch the second dielectric layer 27 and expose the first dielectric layer 26 to the desired degree are well known to those skilled in the art and will not be discussed further so as to not obscure the present invention. In other words, the memory array region 25 is exposed for further etching processing, e.g., an isotropic etching process has been performed in the second dielectric layer 27 to etch all of the second dielectric layer 27 in the memory array region 25, as shown in FIG. 9.

Figure 10:
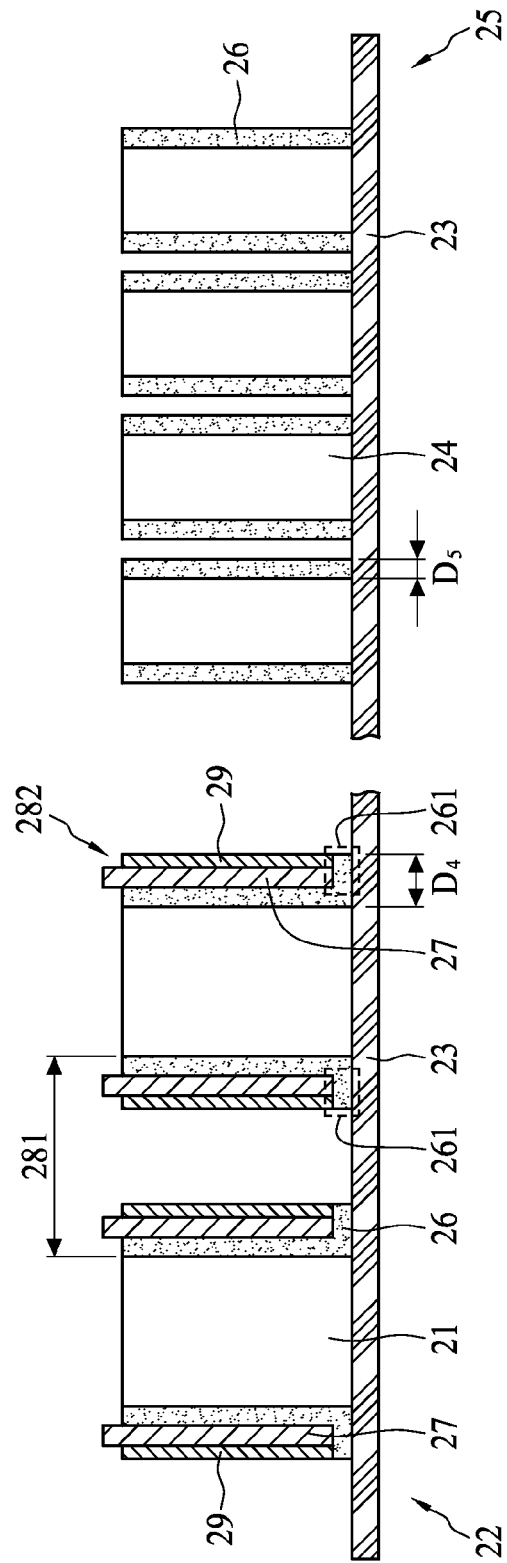

Next, as shown in FIG. 10, the photoresist mask 31 is removed from above the peripheral circuit region 22 using a variety of known techniques, e.g., ashing. Thereafter, an etching process, e.g., an anisotropic etching process, is performed on the third dielectric layer 29 and the first dielectric layer 26 in the peripheral circuit region 22 and the first dielectric layer 26 in the memory array region 25. The etching process etches the third dielectric layer 29 and the first dielectric layer 26 atop the electronic component layer to expose the transistor 21 and the word lines/digit lines 24 and to define at least one of composite spacer 282 adjacent to the transistors 21 of the electronic component layer. The composite spacer 282 includes the first dielectric material 26, the second dielectric material 27, and the third dielectric material 29. The first dielectric material 26 is disposed adjacent to the electronic component layer. The second dielectric material 27 is disposed adjacent to the first dielectric layer 26. The third dielectric material 29 is disposed adjacent to the second dielectric layer 27, wherein the second dielectric material 27 is sandwiched between the first dielectric material 26 and the third dielectric material 29. The first dielectric material 26 has a protruding portion 261. The second dielectric material 27 and the third dielectric material 29 are disposed on the protruding portion 261. As indicated in FIG. 10; the etching process is performed to remove portions of the first dielectric layer 26 and the third dielectric layer 29 that are not protected by the composite spacers 282. In other words, the transistor 21 and the word to lines/digit lines 24 are exposed after the etching process and a composite spacer 282 is formed adjacent to the transistor 21. Moreover, the composite spacers 282 perform a masking function as it relates to etching the underlying first dielectric layer 26 in the peripheral circuit region 22. In the illustrative embodiment wherein the first dielectric layer 26 is comprised of silicon nitride and the composite spacer 282 includes the second dielectric layer 27 composed of silicon dioxide and the third dielectric layer 29 composed of silicon nitride, the etching process is adapted to selectively remove silicon nitride and not remove the silicon dioxide material. This results in the definition of a composite spacer 282 including a portion of the first dielectric layer 26, the second dielectric layer 27, and the third dielectric layer 29. In one illustrative embodiment, the composite spacer 282 may have a thickness at its base D4 of approximately 35 to 75 nm. Note that during the etching process, the portion of the first dielectric layer 26 and the third dielectric layer 29 above the top surface of the nitride cap (not shown) of the transistor 21 are also removed. Also note that since the memory array region 25 is exposed to the etching process, a spacer of the first dielectric layer 26 is formed adjacent to the word line 24 and there may be a slight reduction in the thickness of the nitride cap layer (not shown) of the word lines 24 as well as in the height of the spacers, which has a first thickness D5. In addition, the composite spacers 282 in the peripheral circuit region 22 have a generally tapered cross-sectional configuration and a thickness D4. In one illustrative embodiment shown in FIG. 10, the thickness D4 of the spacers 282 may be approximately 30% of the space 281 between the transistors 21. In one particularly illustrative embodiment, the thickness D4 of the composite spacers 282 may be preferably 21 to 37 nm. The etching process parameters and the etchant materials employed to etch the third dielectric layer 29 and the first dielectric layer 26, and expose the second dielectric layer 27, the transistors 21 and the word lines 24 of the electronic component layer to the desired degree, are well known to those skilled in the art and will not be discussed further so as to not obscure the present invention.

Next, a photoresist mask (not shown) is formed above the memory array region 25 using known photolithography techniques. Thereafter, an ion implantation process is performed to form the source/drain regions (not shown) for the transistors 21 in the peripheral circuit region 22. Note that during this process, the location of the source/drain implant is determined by the width D4 of the composite spacer 282 formed in the peripheral circuit region 22. In particular, the third dielectric layer 29 protects the second dielectric layer 27 from oxide based etch chemistries used in source/drain implant resist strip and clean process. Loss of second dielectric material 27 can cause the source drain implants to penetrate through the thickness of the composite spacer, and therefore the approach detailed in this invention helps to reduce device variability and significantly improve short channel effect. Also, the presence of oxide based second dielectric material 27 sandwiched between the first dielectric material 26 and the third dielectric material 29 in the composite spacer 282 helps reduce the parasitic capacitance component.

The present invention is generally directed to a method of manufacturing sidewall spacers on a memory device. In one illustrative embodiment, the method comprises forming sidewall spacers on a memory device comprised of a memory array region and at least one peripheral circuit region by forming a first sidewall spacer adjacent to a word line structure in the memory array region, the first sidewall spacer having a first thickness and forming a second sidewall spacer adjacent to a transistor structure in the peripheral circuit region, and the second sidewall spacer having a second thickness that is greater than the first thickness, wherein the first and second sidewall spacers comprise material from a single layer of spacer material.

In yet another illustrative embodiment, the method comprises depositing a layer of spacer material above a word line in a memory array region of a memory device and above a transistor structure in a peripheral circuit region of the memory device, forming a masking layer above the layer of spacer material positioned above the transistor structure of the peripheral circuit, and performing an anisotropic etching process on the layer of spacer material above the word line structure to define a first sidewall spacer for the word lines, the first sidewall spacer being comprised of the spacer material and having a first thickness. The method further involves performing an anisotropic etching process on the dielectric layer to define a masking spacer adjacent to the transistor structure, and performing an etching process on the dielectric layer using the masking spacer as a mask to define a second sidewall spacer adjacent to the transistor structure, the second sidewall spacer having a second thickness that is greater than the first thickness of the first sidewall spacer.

In one illustrative embodiment, the device comprises a memory array region comprised of a plurality of word line structures, each of the plurality of word line structures having a first sidewall spacer formed adjacent thereto, the first sidewall spacer having a first thickness, and a peripheral circuit region comprised of at least one transistor having a second sidewall spacer formed adjacent thereto, the second sidewall spacer having a second thickness that is greater than the first thickness, and the first and second sidewall spacers comprised of a material from a single layer of spacer material.

Although the present invention and its advantages have been described in detail, it should be understood that various changes, substitutions and to alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device having a memory array region and a peripheral circuit region disposed in a semiconductor device, the memory array region having a plurality of digit lines and at least one spacer formed adjacent to the digit lines, the semiconductor device, comprising:
   a substrate;
   an electronic component layer, disposed on the substrate; and
   at least one composite spacer disposed in the peripheral circuit region, adjacent to the electronic component layer and including:
      a first dielectric material, disposed adjacent to the electronic component layer;
      a second dielectric material, disposed adjacent to the first dielectric material; and
      a third dielectric material, disposed adjacent to the second dielectric material, wherein the second dielectric material is sandwiched between the first dielectric material and the third dielectric material, the first dielectric material has a protruding portion, the second dielectric material and the third dielectric material are disposed on the protruding portion,
   wherein an upper edge of the second dielectric material is higher than an upper edge of the first dielectric material in the peripheral circuit region.

2. The semiconductor device of claim 1, wherein the electronic component layer includes a plurality of transistors, a space exists between the transistors, a thickness of the composite spacer is approximately 30% of the space between the transistors.

3. The semiconductor device of claim 2, wherein the thickness of the composite spacer ranges from 21 to 37 nm.

4. A memory device having a memory array region and a peripheral circuit region disposed in a semiconductor device, the memory array region having a plurality of digit lines and at least one spacer formed adjacent to the digit lines, the semiconductor device, comprising:
   a substrate;
   an electronic component layer, disposed on the substrate; and
   at least one composite spacer disposed in the peripheral circuit region, adjacent to the electronic component layer and including:
      a first dielectric material, disposed adjacent to the electronic component layer;
      a second dielectric material, disposed adjacent to the first dielectric material; and
      a third dielectric material, disposed adjacent to the second dielectric material, wherein the second dielectric material is sandwiched between the first dielectric material and the third dielectric material, the first dielectric material has a protruding portion, the second dielectric material and the third dielectric material are disposed on the protruding portion,
   wherein an upper edge of the second dielectric material is higher than an upper edge of the third dielectric material in the peripheral circuit region.

5. The semiconductor device of claim 4, wherein the electronic component layer includes a plurality of transistors, a space exists between the transistors, a thickness of the composite spacer is approximately 30% of the space between the transistors.

6. The semiconductor device of claim 5, wherein the thickness of the composite spacer ranges from 21 to 37 nm.

7. The semiconductor device of claim 4, wherein the upper edge of the second dielectric material is higher than an upper edge of the first dielectric material.

* * * * *